United States Patent
Renna et al.

(10) Patent No.: US 11,894,432 B2
(45) Date of Patent: Feb. 6, 2024

(54) BACK SIDE CONTACT STRUCTURE FOR A SEMICONDUCTOR DEVICE AND CORRESPONDING MANUFACTURING PROCESS

(71) Applicant: STMICROELECTRONICS S.r.l., Agrate Brianza (IT)

(72) Inventors: Crocifisso Marco Antonio Renna, Floridia (IT); Antonio Landi, Scordia (IT); Brunella Cafra, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/573,449

(22) Filed: Jan. 11, 2022

(65) Prior Publication Data

US 2022/0246735 A1 Aug. 4, 2022

(30) Foreign Application Priority Data

Jan. 29, 2021 (IT) .................. 102021000001922

(51) Int. Cl.
| | |
|---|---|
| *H01L 29/417* | (2006.01) |
| *H01L 29/40* | (2006.01) |
| *H01L 29/45* | (2006.01) |
| *H01L 29/66* | (2006.01) |
| *H01L 29/739* | (2006.01) |

(52) U.S. Cl.
CPC ...... *H01L 29/41708* (2013.01); *H01L 29/401* (2013.01); *H01L 29/456* (2013.01); *H01L 29/66333* (2013.01); *H01L 29/7395* (2013.01)

(58) Field of Classification Search
CPC ......... H01L 29/41708; H01L 29/66333; H01L 29/7395; H01L 29/7802; H01L 29/401; H01L 29/456; H01L 21/28518
See application file for complete search history.

(56) References Cited

U.S. PATENT DOCUMENTS

| | | | |
|---|---|---|---|
| 9,685,333 B2 | 6/2017 | Nakajima et al. | |
| 2010/0015141 A1* | 1/2010 | Bursavich | ............... A61P 35/00 514/262.1 |
| 2010/0207125 A1 | 8/2010 | Uchida et al. | |
| 2014/0015141 A1* | 1/2014 | Harrison | ................. H01L 24/05 257/763 |
| 2015/0069614 A1 | 3/2015 | Nishikawa et al. | |
| 2016/0076152 A1* | 3/2016 | Will-Cole | ............. C23C 28/042 428/471 |

(Continued)

FOREIGN PATENT DOCUMENTS

JP 2008085050 A 4/2008

*Primary Examiner* — Wasiul Haider
(74) *Attorney, Agent, or Firm* — Seed IP Law Group LLP

(57) ABSTRACT

Various embodiments provide a vertical-conduction semiconductor device that includes: a silicon substrate having a front face and a rear face; a front-side structure arranged on the front face of the substrate, having at least one current-conduction region at the front face; and a back side metal structure, arranged on the rear face of the substrate, in electrical contact with the substrate and constituted by a stack of metal layers. The back side metal structure is formed by: a first metal layer; a silicide region, interposed between the rear face of the substrate and the first metal layer and in electrical contact with the aforesaid rear face; and a second metal layer arranged on the first metal layer.

20 Claims, 3 Drawing Sheets

(56) References Cited

U.S. PATENT DOCUMENTS

2017/0076948 A1    3/2017  Nakata et al.
2017/0207331 A1    7/2017  Nakanishi et al.
2021/0134584 A1*   5/2021  Chiu ................. H01L 21/02016
2022/0376065 A1*  11/2022  Hatayama ........... H01L 29/1095

* cited by examiner

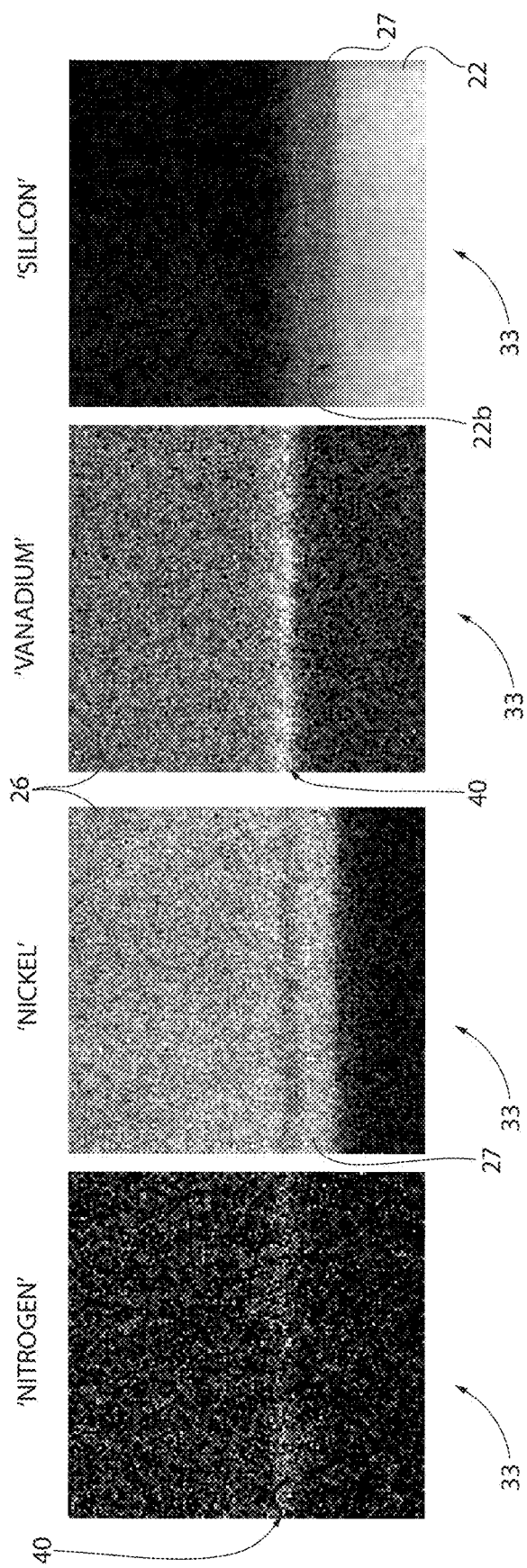

BACK SIDE CONTACT STRUCTURE FOR A SEMICONDUCTOR DEVICE AND CORRESPONDING MANUFACTURING PROCESS

BACKGROUND

Technical Field

The present solution relates to an improved back side contact structure for a semiconductor device and to a corresponding manufacturing process.

Description of the Related Art

Several vertical-conduction semiconductor devices, in particular silicon-based devices for power applications, have a contact or metallization on the back or back side; for example, MOSFET (metal oxide semiconductor field-effect transistor) transistor devices of a VDMOS (Vertical Double-Diffused Metal Oxide Semiconductor) type or transistor devices of an IGBT (Insulated Gate Bipolar Transistor) type are known, in which a flow of current occurs in a vertical direction in the device, towards an electrical contact on the back side.

In this regard, and purely by way of example, FIG. 1 shows, in cross-sectional view, an IGBT (insulated gate bipolar transistor) transistor device 1 with planar configuration, comprising a wafer 1' including a substrate 2, of silicon, for example, with a doping of a $P^+$ type and having a front side 2a and a back side 2b.

A buffer layer 4, of silicon of an $N^+$ type, is formed on the front side 2a of the substrate 2 and a drift layer 6, of silicon with a doping of an N" type, is formed on and in contact with the buffer layer 4. The drift layer 6 houses, at a top face 6a thereof, a body region 8, which extends in depth in the drift layer 6 starting from the top face 6a and is formed by implantation of dopant species of a P type. In the body region 8 source regions 10 are formed by implantation of dopant species of an N type, to form regions with $N^+$ doping extending in the body region 8 starting from the top face 6a.

The IGBT transistor device 1 further comprises a front-side metal layer 12 formed on the top face 6a of the drift layer 6, in direct contact with the body region 8 and, partially, with the source regions 10. The front-side metal layer 12, having the function of emitter contact of the IGBT transistor device 1, is separated from external portions (external in top view) of the body region 8 by overlapped layers of insulating material 14 and conductive material 16 so that the conductive layer 16, for example, of polysilicon, is electrically insulated both from the top face 6a and from the front-side metal layer 12 by a respective layer of insulating material 14, thus forming a gate structure 18 of the IGBT transistor device 1.

In particular, on the back side 2b of the substrate 2, a back side metal structure 19 is formed, in direct electrical contact with the substrate 2, in this case constituting the collector contact of the IGBT transistor device 1.

Common solutions for providing the back side metal structure of vertical-conduction semiconductor devices envisage a stack of three or four metal layers, typically obtained with PVD (Physical Vapour Deposition) techniques in sequence and without vacuum interruption, for example, with sputtering techniques.

In particular: a first metal layer, for example, of aluminium (Al), arranged in direct contact with the silicon substrate, guarantees an electrical contact with the same substrate; a second metal layer, overlapping the aforesaid first layer, for example, of titanium (Ti), constitutes a barrier against diffusion; a third metal layer, overlapping the aforesaid second layer, for example, of nickel-vanadium (NiV), constitutes an active soldering layer for coupling, for example, to a support (such as a so-called leadframe) of a package in which the semiconductor device is enclosed; and a fourth metal layer, overlapping the third layer, for example, of silver (Ag), acts as a protection from oxidation.

Recent power applications for silicon-based semiconductor devices, in particular in the automotive field or other industrial fields, thin the wafer, for example, even down to 40 µm, and an increase of the total thickness of the metal stack on the back side of the same wafer.

A problem regarding the back side metal stack is the high bending induced on the wafer, especially in the case of thin wafers (<100 µm), which causes handling problems in the final manufacturing steps and problems of reliability of the resulting devices, with possible failure or drops in production yield.

Furthermore, for some devices, setting up a good electrical contact involves costly and unproductive methods to limit the temperature reached by the wafer in each one of the deposition steps involved in the formation of the back side metal stack.

For instance, if electrical contact to the substrate is by an aluminium layer, an important role is played by the so-called spiking process, caused by diffusion of silicon in the aluminium, with consequent creation of voids in the surface of the silicon, which are rapidly filled by the aluminium, and in particular by the distribution and density of the resulting "spikes" on the rear surface of the wafer; this process utilizes a high temperature, with consequent high stresses induced on the wafer by the back side metallization, for example, with values of around 180 MPa.

Solutions used so far for reducing the problems highlighted above consist in a limitation of the thermal stress induced by the deposition (for example, sputtering) process by adoption of techniques of multi-step deposition with repeated and alternating steps of deposition and cooling until a desired total thickness of the stack is reached (for example, according to packaging desires).

The present Applicant has found that the solutions currently used have, however, some limitations and suffer from some drawbacks, in particular due to a reduction, even considerable, of the production efficiency, and to an inadequate management of the stress caused by the metal stack.

BRIEF SUMMARY

Various embodiments disclosed herein overcome the drawbacks of previous solutions by providing an improved solution that represents a good compromise between management of the stress caused by the back side metal stack and the electrical properties of the semiconductor device, in particular ensuring a good electrical contact with the substrate, taking into account the reduction of the thickness of the wafer and the desire to increase the total thickness of the back side metallization.

According to the present solution, a semiconductor device and a corresponding manufacturing process are provided.

BRIEF DESCRIPTION OF THE SEVERAL VIEWS OF THE DRAWINGS

For a better understanding of the present solution, embodiments thereof are now described, purely by way of non-limiting example and with reference to the attached drawings, wherein:

FIGS. 4A, 4B, 4C, and 4D are maps regarding the content of the portion of the semiconductor device illustrated in FIG. 3, each map regarding a respective element.

DETAILED DESCRIPTION

As will be described in detail hereinafter, an aspect of the present solution envisages an alternative embodiment of a back side metal structure (or stack), on the rear side of the substrate or wafer of a semiconductor device, in particular a silicon-based semiconductor device, for example, a device used for power applications.

This alternative embodiment envisages overlapping of just two metal layers on the aforesaid rear side of the substrate.

In particular, a first metal layer, in contact with the substrate, in this case itself constitutes an active soldering layer and is formed by a deposition (in particular PVD) technique and a deposition process such as to ensure concurrent formation of a silicide region, the silicide being a binary compound formed by atoms of metal and silicon, in direct contact with the substrate. This silicide region ensures good electrical contact with the substrate and moreover guarantees a good mechanical strength.

In this solution, just one second metal layer is therefore sufficient, on the first metal layer, having the function of protection from oxidation and moreover forming, together with the first metal layer, a desired thickness for the purposes of packaging of the semiconductor device (the thicknesses of the aforesaid first metal layer and second metal layer being chosen according to the application of the semiconductor device).

Figure 2A:
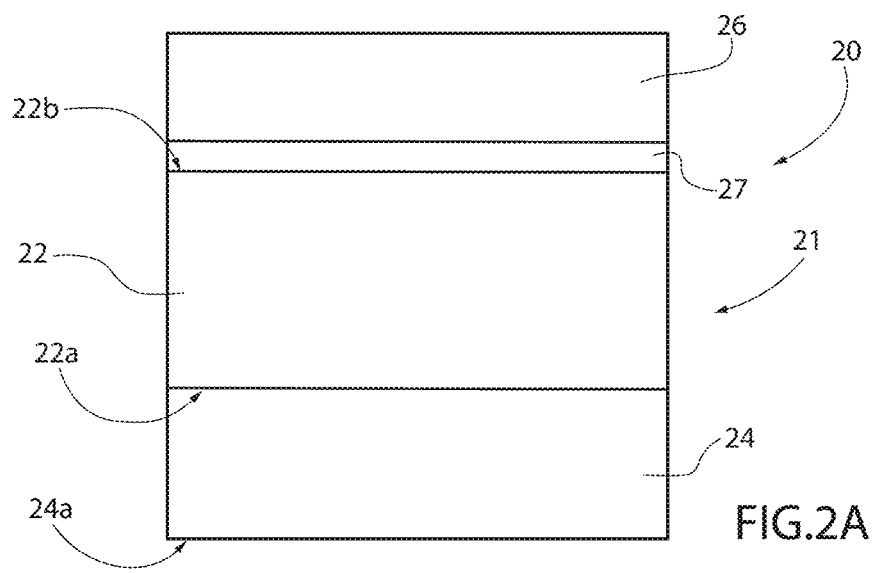
FIGS. 2A-2B are schematic cross-sectional views of a semiconductor device according to an embodiment of the present solution, in successive steps of a corresponding manufacturing process.

With initial reference to FIG. 2A, a process for manufacturing the back side metal structure, according to an embodiment of the present solution, is now disclosed.

In this FIG. 2A, a silicon-based semiconductor device, for example, a power device (such as an IGBT or a VDMOS device), is designated as a whole by 20.

The aforesaid semiconductor device 20 comprises a silicon wafer 21 having a substrate 22, with a front face 22a and a rear face 22b (it should be noted that the wafer 21 has been flipped over to carry out appropriate machining operations on the back).

In a way not described in detail herein, a front-side structure of the semiconductor device 20, designated as a whole by 24, has previously been formed on the front face 22a of the substrate 22, with known techniques.

It is evident that this front-side structure 24 may have a wide range of configurations, in any case comprising at least one current-conduction region at a corresponding front face 24a.

Figure 1:
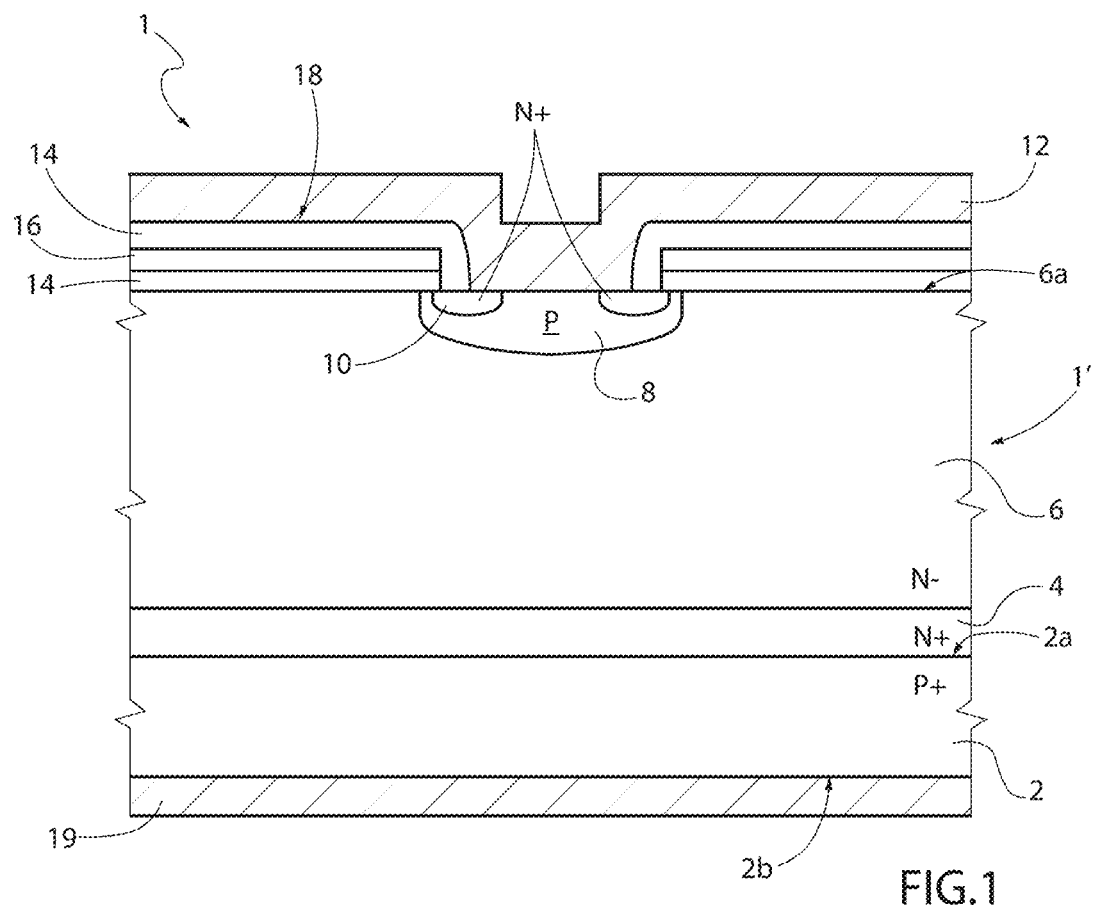
FIG. 1 is a schematic cross-sectional view of an IGBT transistor.

For instance, in the case of a semiconductor device 20 of an IGBT type, the front-side structure 24 comprises (see, in this regard, also FIG. 1), starting from the same substrate 22 in the vertical direction: a buffer layer, a drift layer (formed inside which are body regions and source regions, which in this case define the aforesaid current-conduction region), gate structures, and a front-side metal layer.

The process then envisages machining of the back of the wafer 21 and in particular formation, on the rear face 22b of the substrate 22, of a first metal layer 26, by, for example, a PVD technique.

In an embodiment, the aforesaid first metal layer 26 is a nickel-vanadium (NiV) layer, with a variable concentration of vanadium ranging from 5 wt % to 8 wt %.

In a possible embodiment, the first metal layer 26, which may have, for example, a thickness comprised between 300 nm and 700 nm, is formed by the sputtering technique, for example, using argon (Ar) and nitrogen ($N_2$) as process gases in the deposition chamber.

According to an aspect of the present solution, the deposition is properly adjusted to reach in-situ a temperature such as to trigger a silicide-formation reaction process on the substrate 22, with formation, during the same step of deposition of the first metal layer 26, of a silicide region 27, in particular of a nickel silicide, interposed between the rear face 22b of the substrate 22 and the aforesaid first metal layer 26. For instance, the temperature of the deposition chamber is controlled so as to be higher than 400° C., for example, so as to remain in a range comprised between 400° C. and 500° C. during deposition.

The aforesaid silicide region 27, in contact with the first metal layer 26, is therefore set in electrical contact with the rear face 22b of the substrate 22.

The silicide region 27 moreover has a thickness smaller than the thickness of each of the first and second metal layers 26, 28.

Figure 2B:
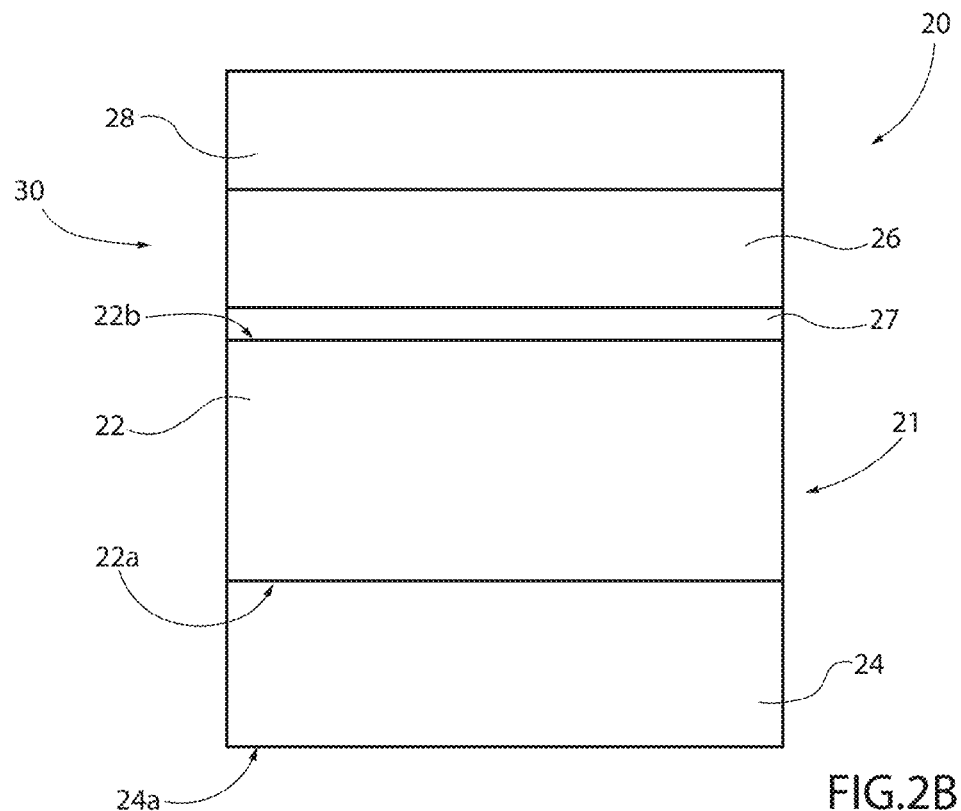

Next, as illustrated in FIG. 2B, a second metal layer 28 is formed, for example, once again by the PVD technique, overlapping the first metal layer 26.

The second metal layer 28, which may have a thickness comprised between 150 nm and 500 nm, is, for example, a layer of silver (Ag).

The aforesaid first metal layer 26 (with the corresponding silicide region 27) and the aforesaid second metal layer 28, stacked on one another, form in this case the back side metal structure, designated as a whole by 30, of the semiconductor device 20, in electrical contact with the substrate 22, in particular with at least one current-conduction region arranged at the rear face 22b of the substrate 22 (a current conduction path being defined in a vertical direction through the substrate 22, between the current-conduction region arranged at the front face 24a of the front-side structure 24 and the aforesaid current-conduction region arranged at the rear face 22a of the substrate 22).

In other words, in this case the back side metal structure 30 is formed exclusively by the aforesaid first and second metal layers 26, 28 with the silicide region 27 interposed between the substrate 22 and the first metal layer 26.

Figure 3:
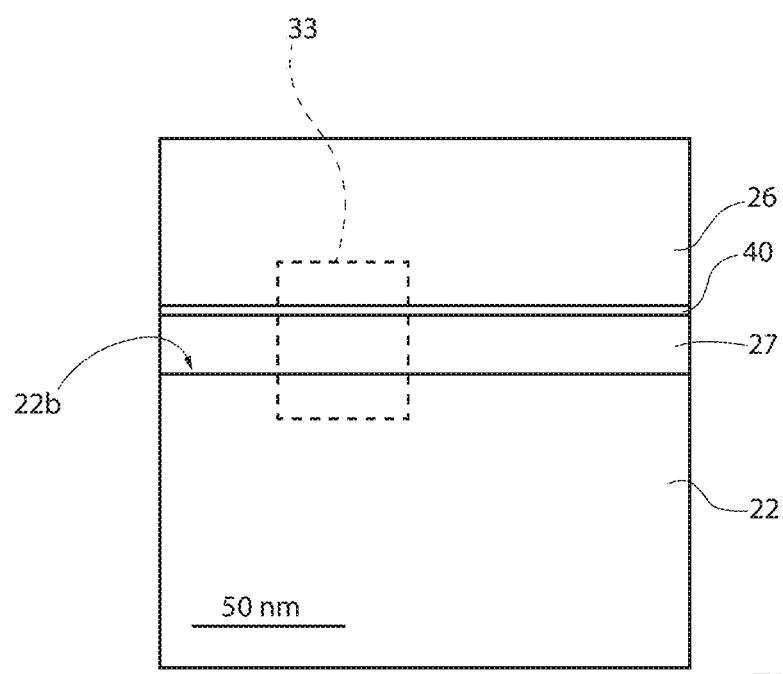
FIG. 3 is an enlarged cross-sectional image of a portion of the semiconductor device of FIGS. 2A and 2B.

In greater detail, reference is made also to FIG. 3 (which shows an enlarged image in cross-sectional view of a portion of the wafer 21) and to the maps of the elements (respectively nitrogen, nickel, vanadium, and silicon) illustrated in FIGS. 4A-4D, referring to the region 33 highlighted in the same FIG. 3, of transition between the substrate 22 and the first metal layer 26, having in this case a thickness, for example, of some tens of nanometres.

Proceeding towards the silicon substrate in this enlarged cross-sectional view, a region (designated by 40) is immediately in contact with the uniform and polycrystalline NiV layer (the aforesaid first metal layer 26), having a thickness, for example, of a few tens of angstrom and in which, in some embodiments, only nitrogen and vanadium atoms are present; this is followed by the silicide region 27, characterized by the simultaneous presence of Ni and Si, as highlighted by the chemical maps, having a thickness, for example, of a few tens of nanometres, in direct contact with the rear face 22b of the substrate 22.

Basically, the aforesaid FIGS. 3 and 4A-4D highlight the process, concurrent to the sputtering deposition of the first metal layer 26, of formation of the silicide region 27, which "kicks out" the nitrogen and vanadium atoms at the interface with the substrate 22.

One aspect of the present solution lies in this nickel silicide formation, concurrent with the deposition of the first metal layer 26.

For the purpose of a more accurate control of the deposition temperature (and, simultaneously, of the silicidation process) and in order to reduce the thermal stress, it may be advantageous to carry out a multi-step deposition process.

In a possible implementation, this step of sputtering deposition is carried out with the following process characteristics: electric power comprised between 1 kW and 10 kW; flow of Ar comprised between 20 sccm and 90 sccm; and flow of $N_2$ comprised between 0 sccm and 40 sccm. As it has been mentioned, this deposition is advantageously carried out by a plurality of steps of deposition and stabilization (or cooling) of appropriate duration, in which the process parameters assume values comprised in the range previously referred to.

For instance, a possible multi-step process for providing the first metal layer 26 with a thickness of 500 nm may envisage a pump-down and stabilization step in the process-gas chamber, followed by successive steps of deposition and cooling, reiterated for a number of times such as to reach the desired NiV thickness, the first of the deposition and cooling steps possibly being implemented, for example, at a sputtering power higher than the subsequent ones.

In a similar manner, also the step of deposition of the second metal layer 28, with a variable thickness between 150 nm and 500 nm, can be carried out by a respective multi-step process with a respective plurality of deposition and stabilization steps of appropriate length, in which the process parameters assume values comprised in the ranges previously referred to.

Experimental tests made by the present Applicant have demonstrated the possibility of obtaining, with substantially the same values of warpage of the wafer 21 of the semiconductor device 20, values of thickness of the back side metal structure 30 that are decidedly greater than those of traditional structures (for example, a value of thickness of 800 nm as compared to a value of thickness of 500 nm of a traditional structure with three metal layers).

Likewise, given, instead, the same thickness of the back side metal stack, the possibility has been demonstrated of reducing considerably the resulting deformation of the wafer 21 of the semiconductor device 20.

Advantageously, the present Applicant has shown, with experimental tests, that the electrical performance of the semiconductor device 20 does not undergo substantial modifications, in particular with reference to the threshold voltage and breakdown voltage values, which remain substantially unchanged (once again as compared to a traditional structure with three metal layers).

Furthermore, the present Applicant has found an increase in the yield of the manufacturing process even of up to 30% as compared to a traditional process.

The advantages achieved by the present solution emerge clearly from the foregoing description.

In any case, it is emphasized that this solution affords a saving in the manufacturing costs, the back side metal structure 30 being composed of a small number of layers, i.e., just two metal layers (instead of three or four as in known solutions), and moreover the production yield (the so-called process throughput) being higher (even by as much as 30%).

The strength of the semiconductor device 20 is improved, thanks in particular to the fact that the silicidation process implies mixing between atoms of the substrate and of the silicide (in this case, between nickel and silicon atoms), therefore guaranteeing fewer problems linked to peeling phenomena.

In addition, as mentioned, it is possible to reduce the stress to which the back side metal structure 30 subjects the wafer 21, given a same thickness of the same back side metal structure 30, as compared to structures of a traditional type (or else, alternatively, it is possible to increase the thickness of the back side metal structure 30, given a same stress applied to the wafer 21).

Basically, the present solution enables a better management of the deformation of the wafer 21, even in the case of a thick back side metal stack and a small thickness of the same wafer 21.

Finally, modifications and variations may be made to the present solution.

In particular, it is underlined that different materials or combinations of materials could in general be envisaged for providing the back side metal structure 30 and in particular for forming the silicide region 27; for example, the first metal layer 26 could be comprised of nickel, without the percentage component of vanadium, and/or the second metal layer 28 could be comprised of a material other than silver, such as gold (Au).

In addition, the reaction gases present in the deposition chamber during the sputtering process could be different; for example, just argon could be present (instead of the argon and nitrogen mixture).

It is moreover underlined that the present solution can find advantageous application in different semiconductor silicon devices, for example, signal or power VDMOS devices, IP (Intelligent Power) MOSFET devices, such as VIPower™ MOSFET devices, in general in all devices where the conductivity is vertical and where on the rear side of the wafer the presence of an electrical contact or of an active terminal of the same device is used.

In one or more embodiments, a vertical-conduction semiconductor device (20) includes: a silicon substrate (22) having a front face (22a) and a rear face (22b); a front-side structure (24) arranged on the front face (22a) of the substrate (22), having at least one current-conduction region at a respective front face (24a); and a back side metal structure (30), arranged on the rear face (22b) of the substrate (22), in electrical contact with the substrate (22) and constituted by an overlapped stack of metal layers, characterized in that said back side metal structure (30) may include: a first metal layer (26); a silicide region (27), interposed between the rear face (22b) of the substrate (22) and said first metal layer (26) and in electrical contact with said rear face (22b); and a second metal layer (28) arranged on the first metal layer (26).

The back side metal structure (30) may be constituted exclusively by the first (26) and the second (28) metal layers, stacked on the silicide region (27).

The first metal layer (26) may be mainly composed of nickel, and the silicide may be a nickel silicide.

The first metal layer (26) may be composed of nickel and vanadium with a concentration of vanadium comprised between 5 wt % and 8 wt %.

The second metal layer (28) may be composed of silver, or gold.

The first metal layer (26) may have a thickness comprised between 300 nm and 700 nm, the second metal layer (28) may have a thickness comprised between 150 nm and 500 nm, and the silicide region (27) may have a thickness smaller than the thickness of said first (26) and said second (28) metal layers.

The vertical-conduction semiconductor device, for power applications, may include at least one IGBT transistor.

In one or more embodiments, a process for manufacturing a vertical-conduction semiconductor device (20) includes: providing a silicon substrate (22) having a front face (22a) and a rear face (22b); forming a front-side structure (24) on the front face (22a) of the substrate (22), having at least one current-conduction region at a respective front face (24a); and forming a back side metal structure (30) on the rear face (22b) of the substrate (22) and in electrical contact with the substrate (22), constituted by an overlapped stack of metal layers, characterized in that said step of forming a back side metal structure (30) may include: forming a first metal layer (26) on the rear face (22b) of the substrate (22), said step of forming comprising the concurrent formation of a silicide region (27) in electrical contact with the rear face (22b) of said substrate (22); and forming a second metal layer (28) on the first metal layer (26).

The back side metal structure (30) may be constituted exclusively by said first (26) and second (28) metal layers, with said silicide region (27) interposed between the rear face (22b) of the substrate (22) and said first metal layer (26).

The first metal layer (26) may be mainly composed of nickel, and said silicide may be a nickel silicide.

The first metal layer (26) may be composed of nickel and vanadium with a concentration of vanadium comprised between 5 wt % and 8 wt %.

The second metal layer (28) may be composed of silver, or gold.

The step of forming a first metal layer (26) may be carried out by PVD (Physical Vapour Deposition), controlled to reach a temperature such as to trigger formation, during the deposition, of the silicide region (27), interposed between the rear face (22b) of the substrate (22) and said first metal layer (26). The temperature may be controlled so as to remain in a range comprised between 400° C. and 500° C. The step of forming a first metal layer (26) may be carried out by sputtering deposition. The sputtering deposition may envisage the use of argon (Ar) and nitrogen ($N_2$) as process gases in the deposition chamber. The sputtering deposition may be carried out with the following process characteristics: electric power comprised between 1 and 10 kW; flow of argon comprised between 20 sccm and 90 sccm; flow of nitrogen comprised between 0 sccm and 40 sccm.

The step of forming a first metal layer (26) may be carried out by a multi-step deposition comprising repeated and alternating steps of deposition and cooling or stabilization, until a desired total thickness is reached.

The step of forming a second metal layer (28) may be carried out by a respective PVD (Physical Vapour Deposition).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical-conduction semiconductor device, comprising:
   a silicon substrate having a front face and a rear face;
   a front-side structure on the front face of the silicon substrate, the front-side structure having at least one current-conduction region at a respective front face; and
   a back side metal structure on the rear face of the silicon substrate, in electrical contact with the silicon substrate, and including an overlapped stack of metal layers,
   the back side metal structure including:
      a first metal layer including nickel and vanadium;
      a silicide region between the rear face of the silicon substrate and the first metal layer, and in electrical contact with the rear face of the silicon substrate, the silicide region including nickel silicide;
      an interface region between the first metal layer and the silicide region, the interface region including nitrogen and vanadium; and
      a second metal layer on the first metal layer.

2. The device according to claim 1, wherein the back side metal structure is constituted exclusively by the first and the second metal layers, stacked on the silicide region and the interface region.

3. The device according to claim 1, wherein the first metal layer includes nickel and vanadium with a concentration of vanadium between 5 wt % and 8 wt %.

4. The device according to claim 1, wherein the second metal layer includes silver or gold.

5. The device according to claim 1, wherein the first metal layer has a thickness between 300 nanometers (nm) and 700 nm, the second metal layer has a thickness between 150 nm and 500 nm, and the silicide region has a thickness smaller than the thickness of the first metal layer and the thickness of the second metal layer.

6. The device according to claim 1, wherein the device is configured for power applications, and the front-side structure includes at least one IGBT transistor.

7. A process for manufacturing a vertical-conduction semiconductor device, the process comprising:
   providing a silicon substrate having a front face and a rear face;
   forming a front-side structure on the front face of the silicon substrate, the front-side structure having at least one current-conduction region at a respective front face; and
   forming a back side metal structure on the rear face of the silicon substrate and in electrical contact with the silicon substrate, the back side metal structure including an overlapped stack of metal layers,
   the forming of the back side metal structure including:
      forming a first metal layer and a silicide region, the silicide region being between the rear face of the silicon substrate and the first metal layer, the silicide region being in electrical contact with the rear face of the silicon substrate, the forming of the first metal layer being carried out by PVD (Physical Vapour Deposition), which is controlled to reach a temperature that triggers formation, during the PVD, of the silicide region; and
      forming a second metal layer on the first metal layer.

8. The process according to claim 7, wherein the back side metal structure is constituted exclusively by the first and the second metal layers.

9. The process according to claim 7, wherein the first metal layer includes nickel, and the silicide region is a nickel silicide region.

10. The process according claim 7, wherein the first metal layer includes nickel and vanadium with a concentration of vanadium between 5 wt % and 8 wt %.

11. The process according to claim 7, wherein the second metal layer includes silver or gold.

12. The process according to claim 7, wherein the temperature is controlled so as to remain in a range between 400° C. and 500° C. during the PVD.

13. The process according to claim 7, wherein the forming of the first metal layer is carried out by sputtering deposition.

14. The process according to claim 13, wherein the sputtering deposition utilizes argon (Ar) and nitrogen ($N_2$) as process gases in a deposition chamber.

15. The process according to claim 14, wherein the sputtering deposition is carried out with the following process characteristics: electric power between 1 and 10 kW; flow of argon between 20 sccm and 90 sccm; flow of nitrogen between 0 sccm and 40 sccm.

16. The process according to claimer 7 wherein the forming of the first metal layer is carried out by a multi-step deposition including repeated and alternating steps of deposition and cooling or stabilization, until a predetermined total thickness is reached.

17. The process according to claim 7, wherein the forming of the second metal layer is carried out by a respective PVD.

18. A method, comprising:
forming a first structure on a first side of a substrate, the first structure including at least one current-conduction region; and
forming a second structure on a second side, opposite the first side, of the substrate, the second structure being electrically coupled to the substrate, the forming of the second structure including:
forming a first conductive layer and a silicide region on the second side of the substrate, the silicide region being between the second side of the substrate and the first conductive layer, the silicide region being electrical coupled to the substrate, the forming of the first conductive layer being performed at a temperature that triggers the forming of the silicide region; and
forming a second conductive layer on the first conductive layer.

19. The method of claim 18, wherein the second structure is a contact structure.

20. The method of claim 18, wherein the first conductive layer includes nickel, the silicide region includes nickel silicide, and the second conductive layer includes silver or gold.

* * * * *